United States Patent
Yu et al.

(10) Patent No.: US 6,459,141 B2
(45) Date of Patent: *Oct. 1, 2002

(54) METHOD AND APPARATUS FOR SUPPRESSING THE CHANNELING EFFECT IN HIGH ENERGY DEEP WELL IMPLANTATION

(75) Inventors: Bin Yu, Sunnyvale; Che-Hoo Ng, San Martin, both of CA (US)

(73) Assignee: Advanced Micro Devices, Inc., Sunnyvale, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/495,075

(22) Filed: Jan. 31, 2000

Related U.S. Application Data

(60) Provisional application No. 60/166,763, filed on Nov. 22, 1999.

(51) Int. Cl.$^7$ .......................... H01L 29/04; H01L 29/76; H01L 29/167
(52) U.S. Cl. .................. 257/611; 257/65; 257/376; 257/607; 257/610; 438/514; 438/543
(58) Field of Search .................. 257/65, 376, 611, 257/607, 610; 438/526, 529, 520

(56) References Cited

U.S. PATENT DOCUMENTS 5,770,485 A * 6/1998 Gardner et al. ............. 438/162
5,807,771 A * 9/1998 Vu et al. ..................... 438/154

* cited by examiner

*Primary Examiner*—Steven Loke
*Assistant Examiner*—Donghee Kang
(74) *Attorney, Agent, or Firm*—LaRiviere, Grubman & Payne, LLP

(57) ABSTRACT

The invention provides an improved well structure for electrically separating n-channel and p-channel MOSFETs. The invention first forms a shallow well in a substrate. A buried amorphous layer is then formed below the shallow well. A deep well is then formed below the buried amorphous layer. The substrate is then subjected to a rapid thermal anneal to recrystallize the buried amorphous layer. The well structure is formed by the shallow well and the deep well. A conventional semiconductor device may then be formed above the well structure. The buried amorphous layer suppresses the channeling effect during the forming of the deep well without requiring a tilt angle.

7 Claims, 2 Drawing Sheets

METHOD AND APPARATUS FOR SUPPRESSING THE CHANNELING EFFECT IN HIGH ENERGY DEEP WELL IMPLANTATION

RELATED APPLICATION

This application claims priority from and is related to co-pending with Provisional patent application Ser. No. 60/166,763, entitled: "Method And Apparatus For Suppressing The Channeling Effect In High Energy Deep Well Implantation," filed Nov. 22, 1999, by the same applicants.

FIELD OF THE INVENTION

The present invention relates to the manufacture of semiconductor chips. More specifically, the present invention relates to a method and apparatus for providing a deep well in the production of CMOS devices.

BACKGROUND OF THE INVENTION

In CMOS fabrication processes, well (or tub) structures are needed to electrically separate n-channel and p-channel MOSFETs. High-energy (MeV) ion implantation is needed to form a deep well with a depth of 800 to 2,000 nm. The projection range $R_P$ of the high-energy implant is typically 400 to 1,000 nm. For such a high-energy implant, the channeling effect, in which the dopant profile possesses a long tail along certain crystal orientations, is a major problem in well formation. The channeling effect degrades the electrical isolation capability of a well.

For uniform implantation, it is a common practice to implant the dopant with a tilt angle rather than implant vertically to the silicon wafer (zero-tilt) to avoid axial channeling. However, due to present small transistor sizes, the tilt angle can distort the implant symmetry (i.e. the placement of precise doping and concentration). If scanning or batch implantation techniques are also used, this problem will be compounded. Therefore, it is desirable to avoid axial channeling while using a zero tilt implant.

BRIEF SUMMARY OF THE INVENTION

It is an object of the invention to provide high-energy implants with minimal channeling effect.

It is another object of the invention to provide high-energy implants with minimal implant symmetry distortion.

Accordingly, the foregoing objects are accomplished on a semiconductor substrate, by forming a buried amorphous layer within the semiconductor substrate, forming a deep well layer below the buried amorphous layer, and then recrystallizing the buried amorphous layer.

Other features of the present invention are disclosed or apparent in the section entitled: "DETAILED DESCRIPTION OF THE INVENTION."

BRIEF DESCRIPTION OF DRAWINGS

For a fuller understanding of the present invention, reference is made to the accompanying drawings wherein.

Reference numbers refer to the same or equivalent parts of the present invention throughout the several figures of the drawings.

DETAILED DESCRIPTION OF THE INVENTION AND BEST MODE OF THE INVENTION

Figure 1:
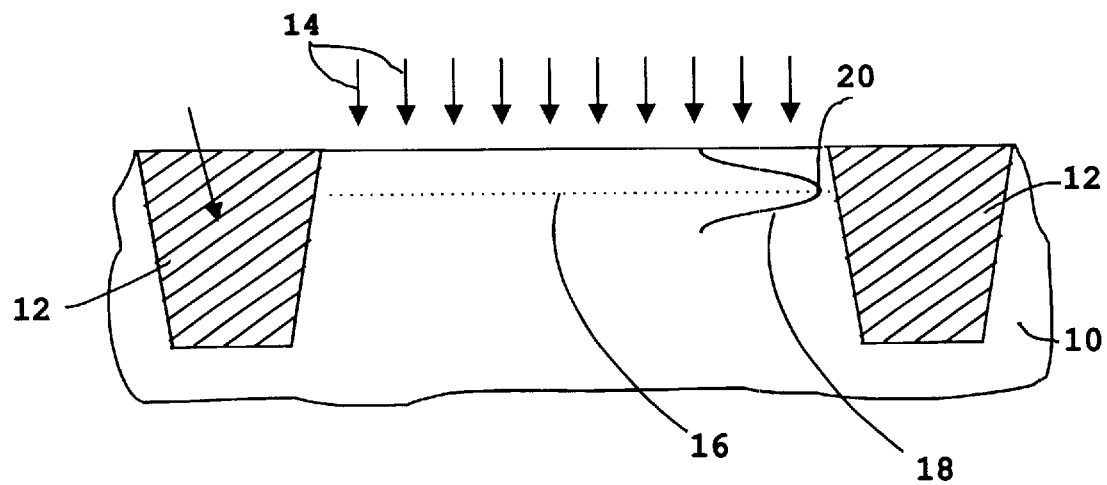
FIG. 1 is a cross sectional view of a substrate undergoing a shallow well implant in a preferred embodiment of the invention.

FIG. 1 is a cross-sectional view of a semiconductor substrate 10 with isolation trenches 12. The semiconductor substrate 10 is subjected to a shallow well implant 14 with a zero degree tilt to form a shallow well layer 16, which extends between the isolation trenches 12. A shallow well concentration curve 18 schematically illustrates the concentration of the implant according to depth within the substrate 10. The peak 20 of the shallow well concentration curve 18 is located at the depth within the substrate where the implant concentration is the highest. In the preferred embodiment, for a P-well, indium is used as the dopant for the shallow well implant 14. The indium is implanted with an energy of 90–140 keV and a dose of $5-8 \times 10^{12}$ atoms·cm$^{-2}$ to form a steep retrograde well (SRW) as the shallow well layer 16. The steep retrograde well suppresses source-to-body punch through leakage in a MOSFET while not degrading the carrier mobility in the surface channel.

Figure 2:
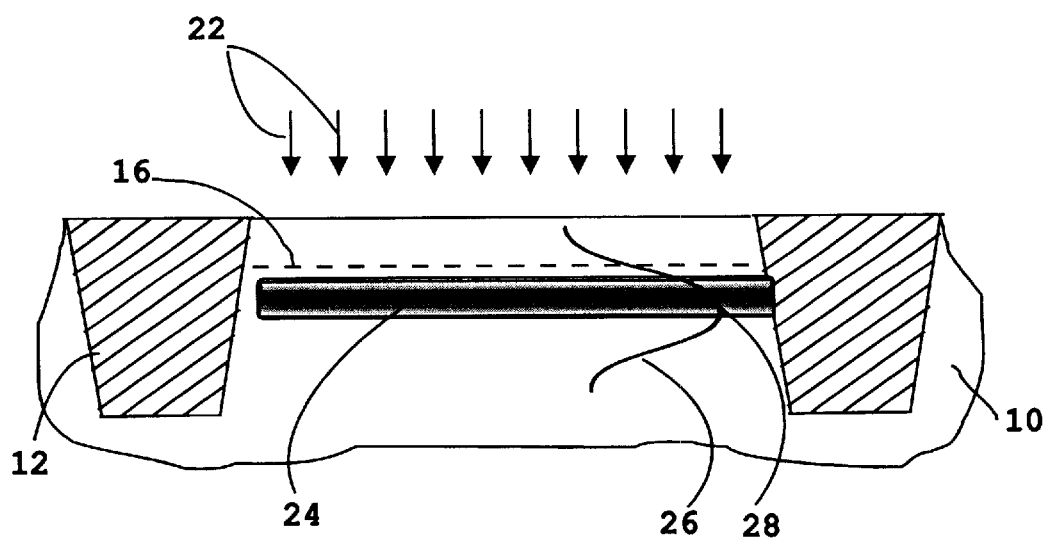
FIG. 2 is a cross sectional view of the substrate shown in FIG. 1 undergoing an amorphization implant according to the preferred embodiment of the invention.

FIG. 2 is a cross-sectional view of the semiconductor substrate 10 undergoing an amorphization implant 22 with a zero degree tilt to create a buried amorphous layer 24 below the shallow well layer 16. An amorphized silicon concentration curve 26 illustrates the concentration of the amorphized silicon according to the depth within the substrate 10. The peak 28 of the amorphized silicon concentration curve 26 is located at the depth within the substrate 10 where the amorphized silicon concentration is the highest. In the preferred embodiment, the amorphization implant 22 uses a species with a high atomic mass to form a relatively thin buried amorphous layer 24. Such species may be a neutral species (nondopant) such as silicon (Si$^+$) at 90 keV, germanium (Ge$^+$) at 180–200 keV, or xenon (Xe$^+$) at 300–340 keV or may be a non-neutral species (dopant) such as indium (In) at 300 keV. In the preferred embodiment, the peak 28 of the amorphized silicon concentration curve is deeper than about 50 nm from the surface of the substrate 10.

Figure 3:
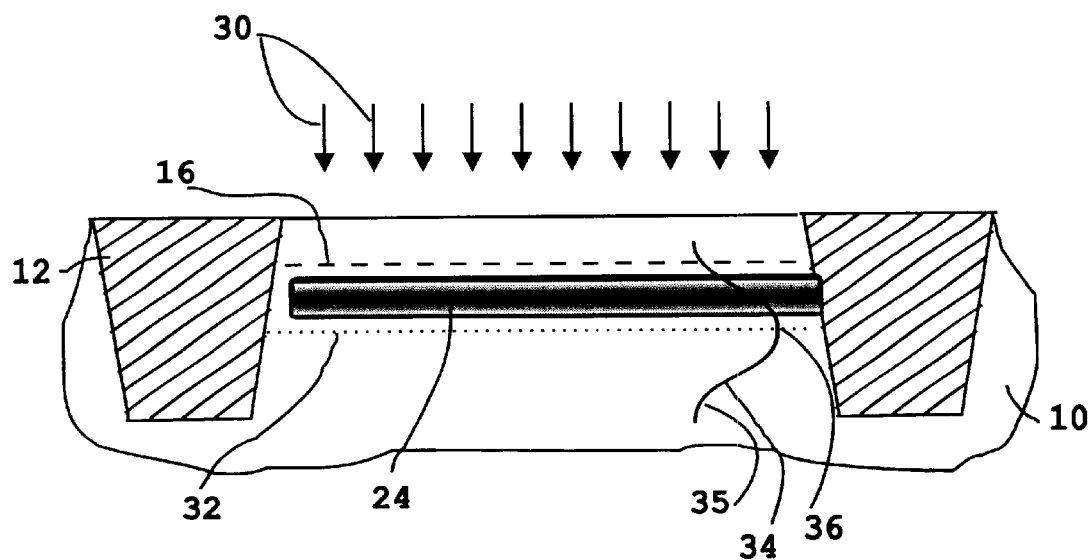
FIG. 3 is a cross sectional view of the substrate shown in FIG. 1 undergoing a deep well implant according to the preferred embodiment of the invention.

FIG. 3 is a cross-sectional view of the semiconductor substrate 10 undergoing a deep well implant 30 with a zero degree tilt to create a deep welllayer 32 below the buried amorphous layer 24. In the preferred embodiment, for a P-well, boron is used as the dopant for the deep well implant 30. The baron is implanted with an energy of 0.2 to 4 MeV and a dose of $5-8 \times 10^{12}$ atoms·cm$^{-2}$. A deep well concentration curve 34 illustrated the concentration of the deep well concentration curve 34 being located at the depth within the substrate 10 where the deep well implant concentration is the highest. The deep well layer 32 being below the buried amorphous layer 24 is defined as the peak 36 of the deep well concentration curve 34 below the peak 28 of theamorphized silicon concentration curve 26 so the most of the deep well implant 30 passes through most of the buried amorphous layer 24. The deep well concentration curve 34 has a tail 35 within the depth of the substrate 10 which is long. In prior art, a long tail would be caused by channeling into the silicon crystal. The amorphized silicon layer 24 lacks a crystal structure, which reduces channeling. The deep well implant helps to suppress CMOS latchup. The substrate 10 is then subjected to a low temperature rapid thermal anneal.

In the preferred embodiment, the low temperature rapid thermal anneal is a temperature of 550–600° C. for 10 to 20 minutes.

Figure 4:
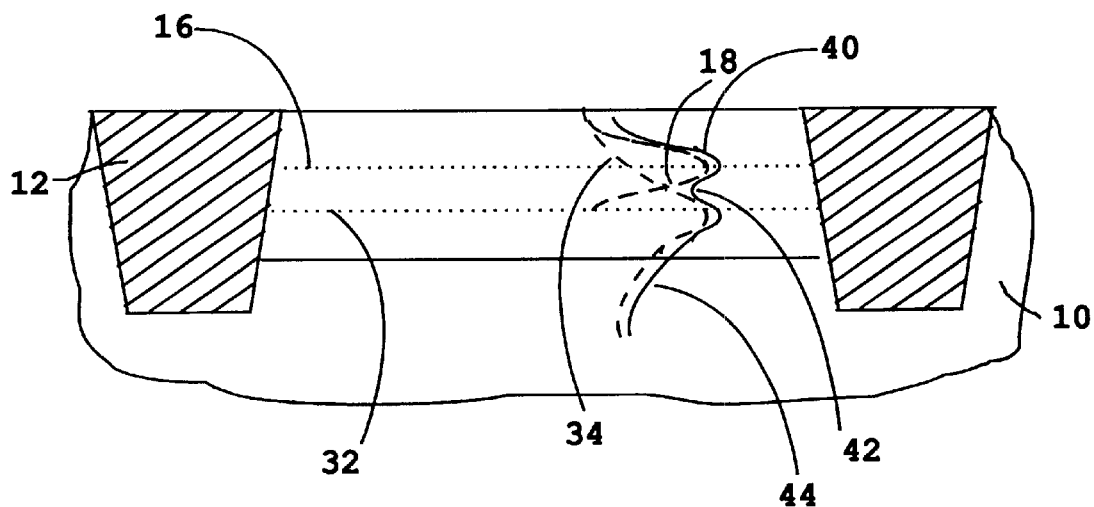
FIG. 4 is a cross sectional view of the substrate shown in FIG. 1 after rapid thermal annealing.

FIG. 4 is a cross sectional view of the semiconductor substrate 10 after it has undergone the low temperature rapid thermal anneal. The rapid thermal anneal causes the buried amorphous layer to recrystallize, which eliminates the buried amorphous layer. The shallow well 16 and the deep well 32, which remain in the substrate 10, form a well (or tub) structure. A well structure curve 40 illustrates the concentration of dopant according to the depth within the substrate 10, which is also the sum of the concentrations from the shallow well layer 16 and the deep well layer 32 which are represented by the shallow well concentration curve 18 and the deep well concentration curve 34. The dopant concentration curve 40 has a reasonably flat peak area 42 and has a tail 44 which is not long, since the buried amorphous layer prevented channeling.

Conventional techniques are then used to build a semiconductor device on the surface of the substrate 10 over the well structure between the isolation trenches 12.

Information as herein shown and described in detail is fully capable of attaining the above-described object of the invention, it is understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

We claim:

1. A semiconductor chip, comprising:
   a buried crystalline layer, comprising indium (In), formed from a buried amorphous layer within a semiconductor substrate;
   a shallow well layer disposed above the buried crystalline layer; and
   a deep well layer disposed below the buried crystalline layer,
   wherein the deep well layer comprises a deep well dopant implanted in the semiconductor substrate, the deep well dopant being passed through the buried amorphous layer, and
   wherein the deep well dopant comprises boron (B) being implanted at a dosage range of approximately $5 \times 10^{12}$ ions/cm$^2$ to approximately $8 \times 10^{12}$ ions/cm$^2$ in an energy range of approximately 0.2 MeV to approximately 4 MeV.

2. A semiconductor chip, comprising:
   a buried crystalline layer,
      the buried crystalline layer comprising:
         at least one buried crystalline layer non-neutral dopant specie; and
         at least one buried crystalline layer neutral non-dopant specie, and
      the buried crystalline layer being formed from a buried amorphous layer within a semiconductor substrate;
   a shallow well layer disposed above the buried crystalline layer,
      the shallow well layer comprising at least one shallow well layer non-neutral dopant specie for forming a steep retrograde well and for suppressing source-to-body punch-through leakage without degrading carrier mobility in a surface channel; and
   a deep well layer disposed below the buried crystalline layer,
      the deep well layer comprising at least one deep well layer non-neutral dopant specie for suppressing latch-up,
   wherein the at least one buried crystalline layer non-neutral dopant specie comprises indium (In),
   wherein the at least one buried crystalline layer neutral non-dopant specie comprises at least one high atomic mass specie selected from a group consisting essentially of silicon (Si), germanium (Ge), and xenon (Xe),
   wherein the at least one shallow well layer non-neutral dopant specie comprises indium (In), and
   wherein the at least one deep well layer non-neutral dopant specie comprises boron (B).

3. A semiconductor chip, as recited in claim 2, wherein the In is implanted at an energy level of approximately 300 keV.

4. A semiconductor chip, as recited in claim 2 wherein the Si is implanted at an energy level of approximately 90 keV.

5. A semiconductor chip, as recited in claim 2, wherein the Ge is implanted in an energy range of approximately 180 keV to approximately 200 keV.

6. semiconductor chip, as recited in claim 2, wherein the Xe is implanted in an energy range of approximately 300 keV to approximately 340 keV.

7. A semiconductor chip, comprising:
   at least one isolation trench extending into a substrate surface;
   a shallow well layer formed within the semiconductor substrate, the shallow well layer comprising a steep retrograde well for suppressing source-to-body punch-through leakage without degrading carrier mobility in a surface channel;
   a buried crystalline layer formed from a buried amorphous layer within the semiconductor substrate; and
   a deep well layer formed within the semiconductor substrate below the buried crystalline layer,
   wherein the buried amorphous layer is formed below the shallow well layer,
   wherein the deep well layer comprises a deep well dopant implanted in the semiconductor substrate,
   wherein the deep well dopant is passed through the buried amorphous layer,
   wherein the buried crystalline layer is disposed in a depth range of greater than approximately 50 nm to approximately less than 200 nm below the surface of the substrate,
   wherein the buried crystalline layer is formed from the buried amorphous layer using a rapid thermal anneal (RTA) process, wherein the deep well dopant comprises boron (B),
wherein the shallow well dopant comprises indium (In),
wherein the buried crystalline layer comprises indium (In) and at least one high atomic mass specie selected from a group consisting essentially of silicon (Si), germanium (Ge), and xenon (Xe), and
wherein the buried crystalline layer is formed in a low temperature range of approximately 550° C. to approximately 650° C. for a duration of approximately 10 minutes to approximately 20 minutes.

* * * * *